(12) United States Patent
Chang et al.

(10) Patent No.: US 6,274,483 B1
(45) Date of Patent: Aug. 14, 2001

(54) METHOD TO IMPROVE METAL LINE ADHESION BY TRENCH CORNER SHAPE MODIFICATION

(75) Inventors: Weng Chang; Ying-Ho Chen, both of Taipei; Syun-Ming Jang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/483,933

(22) Filed: Jan. 18, 2000

(51) Int. Cl.$^7$ ................................................ H01L 21/4763
(52) U.S. Cl. ...................... 438/640; 438/700; 438/713; 438/692; 438/673; 438/633; 438/637; 438/701
(58) Field of Search ...................... 438/640, 638, 438/637, 633, 673, 672, 687, 700, 701, 713, 692; 257/774

(56) References Cited

U.S. PATENT DOCUMENTS

| | | | |
|---|---|---|---|
| 5,453,403 | * | 9/1995 | Meng et al. ........................ 438/734 |
| 5,545,588 | * | 8/1996 | Yoo ..................................... 438/586 |
| 5,705,430 | | 1/1998 | Avanzino et al. .................. 438/618 |
| 5,753,967 | | 5/1998 | Lin ...................................... 257/635 |
| 5,897,375 | * | 4/1999 | Watts .................................. 438/693 |
| 5,933,754 | * | 8/1999 | Mathews et al. ................... 436/629 |
| 5,933,756 | * | 8/1999 | Fuse .................................... 438/640 |
| 5,939,335 | | 8/1999 | Arndt et al. ......................... 438/696 |
| 5,950,102 | | 9/1999 | Lee ...................................... 438/619 |
| 5,960,320 | | 9/1999 | Park .................................... 438/688 |
| 6,022,805 | * | 2/2000 | Sumi ................................... 438/677 |
| 6,117,782 | * | 9/2000 | Lukanc et al. ...................... 438/692 |

* cited by examiner

Primary Examiner—Charles Bowers
Assistant Examiner—Hsien-Ming Lee
(74) Attorney, Agent, or Firm—George O. Saile; Stephen B. Ackerman

(57) ABSTRACT

A new method is provided for the creation of the trenches or line patterns of damascene structures. Under the first embodiment of the invention, the trenches that are created for the copper interconnect lines are sputter etched as a result of which the corners of the trenches around the top elevation of the trenches are rounded. Under the second embodiment of the invention a disposable hard mask is created over the surface of the dielectric after which the trenches for the interconnect lines are created. The surface of the hard mask layer including the created trenches are rf sputter etched resulting in a sharp reduction of the angle of incidence between sidewalls of the trenches around the perimeter of the trenches and the surface of the layer of dielectric. The barrier and seed layers are deposited over the surface of the disposable hard mask including the created trenches, the deposited copper is polished down to the surface of the dielectric.

13 Claims, 3 Drawing Sheets

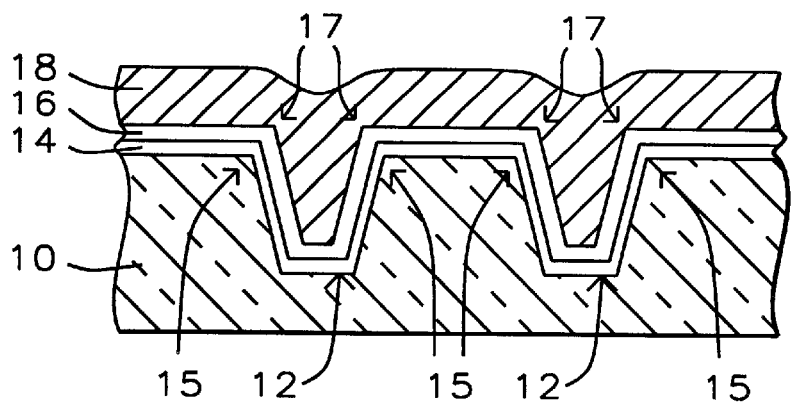
FIG. 1 – Prior Art
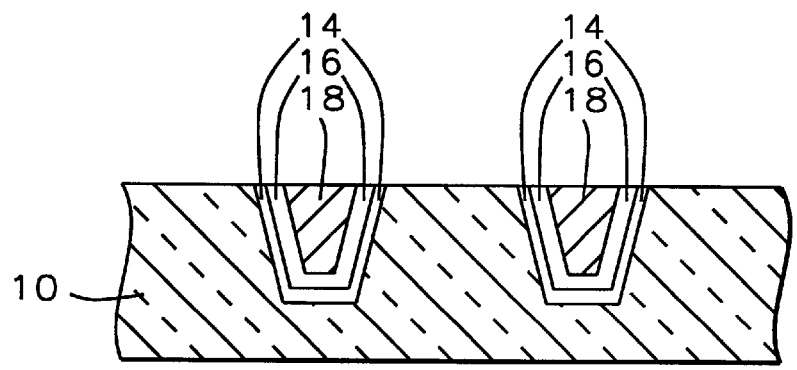
FIG. 2 – Prior Art
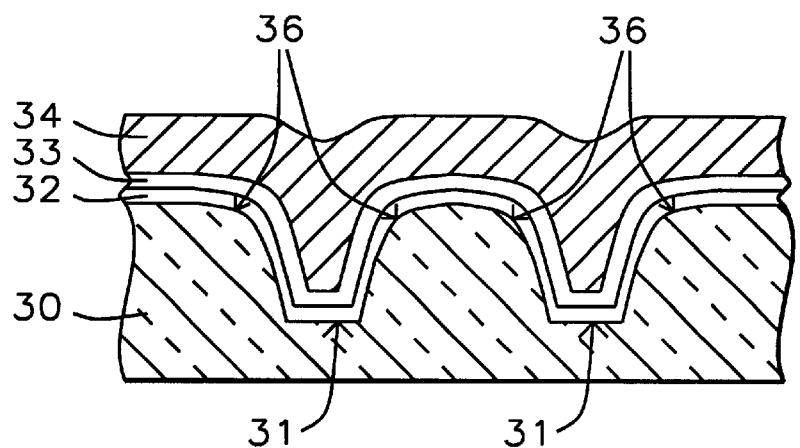
FIG. 3

METHOD TO IMPROVE METAL LINE ADHESION BY TRENCH CORNER SHAPE MODIFICATION

BACKGROUND OF THE INVENTION (1) Field of the Invention

The invention relates to the fabrication of integrated circuit devices, and more particularly, to a method of providing improved damascene metal line adhesion to the line trench by modifying the trench profile.

(2) Description of the Prior Art

In fabricating very and ultra large scale integration (VLSI and ULSI) circuits, one of the more important aspects of this fabrication is the fabrication of metal interconnect lines and vias that provide the interconnection of integrated circuits in semiconductor devices. The continued requirements for device performance improvement that is achieved by continued reductions in device feature size require responsive changes in interconnect technology. The spacing between interconnect lines that are used in high density devices is at this time reduced to 0.35 microns or less. This brings with it increased demands on the profiles and the reliability of the metal interconnect lines.

Conventional methods of forming interconnect lines start with the deposition of a layer of insulation over a semiconductor surface, typically the surface of a single crystal silicon substrate. Openings for via or contact connections are created in this layer of insulation. A layer of metal is deposited over the surface of the layer of insulation, forming a planar surface and filling the via and contact openings. A layer of photoresist is next deposited over the metal layer, the photoresist is patterned for the interconnect line trenches. The layer of metal is etched in accordance with the pattern that has been created in the photoresist thus forming the interconnect line network. The spaces that have been created in the layer of metal (by the etch of the metal layer) are filled with a layer of (intra-metal) dielectric that may or may not be planarized.

The invention specifically addresses the fabrication of conductive lines and vias using the damascene process. Using the dual damascene process, an insulating layer or a dielectric layer, such as silicon oxide, is patterned with a multiplicity of openings for the conductive lines and vias. The openings are simultaneously filled with a metal, such as aluminum, and serve to interconnect the active and/or the passive elements of an integrated circuit. The dual damascene process is also used for forming multilevel conductive lines of metal, such as copper, in the insulating layers, such as polyimide, of multilayer substrates on which semiconductor devices are mounted. Damascene is an interconnection fabrication process in which grooves are formed in an insulating layer and filled with metal to form the conductive lines. Dual damascene is a multi-level interconnection process in which, in addition to forming the grooves of single damascene, conductive via openings also are formed. Dual damascene is an improvement over single damascene because it permits the filling of both the conductive grooves and vias with metal at the same time, thereby eliminating processing steps. The dual damascene process requires two masking steps to form first the via pattern after which the pattern for the conductive lines is formed.

In the standard dual damascene process an insulating layer is deposited over the surface of a substrate and coated with a layer of photoresist, the photoresist is exposed through a via mask, which contains an image pattern of the via openings. The via pattern is anisotropically etched in the upper half of the insulating layer. The photoresist is then exposed through an interconnect line pattern mask with an image pattern of conductive line openings. The second exposure of the interconnecting line pattern is aligned with the via mask pattern to encompass the via openings. In anisotropically etching the openings for the conductive lines in the upper half of the insulating material, the via openings already present in the upper half are simultaneously etched and replicated in the lower half of the insulating material. After the etching is complete, both the vias and line openings are filled with metal. The metal is now polished back to form an inlaid planar dual damascene structure.

Critical to a good dual damascene structure is that the edges of the via openings in the lower half of the insulating layer are clearly defined. Furthermore, the alignment of the two masks is critical to assure that the pattern for the conductive lines aligns with the pattern of the vias. This requires a relatively large tolerance while the via may not extend over the full width of the conductive line.

The metal that is used to construct the interconnect metal features is selected based on such performance characteristics as low resistivity, resistance to electromigration, adhesion to the underlying substrate material, stability (both electrical and mechanical) and ease of processing. For these reasons copper is often selected due to its low resistivity, high electromigration resistance and stress voiding resistance. Copper unfortunately suffers from high diffusivity in common insulating materials such as silicon oxide and oxygen-containing polymers. For instance, copper tends to diffuse into polyimide during high temperature processing of the polyimide. This causes severe corrosion of the copper and the polyimide due to the copper combining with oxygen in the polyimide. This corrosion may result in loss of adhesion, delamination, voids, and ultimately a catastrophic failure of the component. Copper interconnects should therefore be encapsulated by at least one diffusion barrier to prevent diffusion into the silicon dioxide layer. Silicon nitride is a diffusion barrier to copper, but the prior art teaches that the interconnects should not lie on a silicon nitride layer because it has a high dielectric constant compared with silicon dioxide. The high dielectric constant causes an undesired increase in capacitance between the interconnect and the substrate. A typical barrier layer is formed deposited using rf sputtering of titanium nitride, tantalum, tungsten, niobium, molybdenum, Ti/TiN or Ti/W and is more preferably formed from TiN. The barrier layer can also be used to improve the adhesion of the subsequent overlying tungsten layer. A barrier layer is preferably about 100 and 500 angstrom thick and more preferably about 300 angstrom thick.

Copper typically has low adhesive strength to various insulating layers and the difficulty inherent in masking and etching the blanket copper layer into intricate circuit structures. Copper is also very difficult to process using RIE technology, as a consequence of which a method that uses CMP for copper wire formation offers significant advantages. To polish a buried copper wiring formation at a high polishing rate and without damaging the surface, the copper etch rate must be raised by increasing the amount of the component that is responsible for copper etching that is contained in the polishing slurry. If the component continues to be increased, the etching will occur isotropically whereby buried copper is etched away, causing dishing in the wiring. Thus, it is difficult to form a highly reliable LSI wiring made of copper.

To further enhance the adhesion of a copper interconnect line to the surrounding layer of dielectric or insulation, a seed layer is deposited over the barrier layer. A seed layer can be deposited using a sputter chamber or an Ion Metal Plasma (IMP) chamber at a temperature of between about 0 and 300 degrees C. and a pressure of between about 1 and 100 mTorr, using copper or a copper alloy as the source at a flow rate of between about 10 and 400 sccm and using argon as an ambient gas. The minimum thickness of a seed layer is about 50 Angstrom, this thickness is required to achieve a reliable gap fill.

FIG. 1 shows a cross section of a metal interconnect pattern created using Prior Art technology. A metal interconnect pattern 12 is formed in a surface 10, typically the surface of a layer of dielectric or insulation or the surface of a semiconductor substrate. Trenches 12, in this case a damascene or dual damascene opening, have been created in the conventional manner. A barrier layer 14 has been deposited over the sidewalls of the openings 12; a seed layer 16 of pure copper has been deposited over the barrier layer 14. A layer 18 of copper has been blanket deposited over the surface of the seed layer 16 thereby including the trenches 12 that have been created in layer 10. The excess copper is removed using CMP technology down to the level of the surface of layer 10 resulting in a network 18 of interconnect metal of copper (see FIG. 2) that is surrounded by the seed layer 16 and the barrier layer 14 inside the trenches for the interconnect lines.

Of particular concern for the formation of damascene patterns are the regions that have been highlighted as 15 in FIG. 1. The upper edge of the trench 12 is characterized by sharp angles 15 at the intersect of the sidewalls of the trenches 12 with the surface of the layer 10 in which the trenches 12 have been formed. Due to these sharp angles 15, the regions 17 in the immediate vicinity to the angles 15 that form the upper perimeter of the completed damascene interconnect lines are under considerable stress, a stress that is essentially introduced by the abrupt transition from surface area (on the surface of layer 10) to the sidewalls of the trenches 12. Any effort that results in a more gradual transition of the barrier (14), seed (16) and overlying layer of copper from the surface area of layer 10 into the trenches 12 will result in a reduction of the stress pattern in regions 17 of the created interconnect lines.

The process that is shown in FIG. 1 and 2 is applied to 0.18 um (and smaller) CMOS technology. The polishing of the copper metal lines uses, as stated, CMP technology, which results in frequent damage to the surface of the polished copper lines of damascene structures. One of the underlying reasons for this damage is poor adhesion of the deposited copper to the surface of the surrounding trench. The invention addresses this concern and provides a method that improves the copper adhesion.

U.S. Pat. No. 5,960,320 (Park), U.S. Pat. No. 5,705,430 (Avanzino et al.) and U.S. Pat. No. 5,950,102 (Lee) show the dual damascene process. However, these patents do not show the rounded trench corners.

U.S. Pat. No. 5,753,967 (Lin) shows a dual damascene Process with spacers.

U.S. Pat. No. 5,939,335 (Arndt et al.) shows a damascene process with rounded bottom trench corners. However, this reference differs from the invention.

SUMMARY OF THE INVENTION

A principle objective of the invention is to improve adhesion of damascene metal interconnect lines to the surrounding surface.

Another objective of the invention is to reduce damage to the surface of copper interconnect lines that are created using damascene structures after copper CMP.

Yet another objective of the invention is to provide a method for creating damascene trenches that have rounded corners at the top perimeter of the trenches.

A still further objective of the invention is to provide a method that results in significant reduction of stress in the upper perimeter of the barrier layer that underlies copper damascene interconnect lines.

In accordance with the objectives of the invention, a new method is provided for the creation of the trenches or line patterns of damascene structures. Under the first embodiment of the invention, the trenches that are created for the copper interconnect lines are sputter etched as a result of which the corners of the trenches around the top elevation of the trenches are rounded. Under the second embodiment of the invention a disposable hard mask is created over the surface of the dielectric after which the trenches for the interconnect lines are created. The surface of the hard mask layer, including the created trenches, are rf sputter bombarded resulting in a sharp reduction of the angle of incidence between sidewalls of the trenches around the perimeter of the trenches and the surface of the layer of dielectric. The barrier and seed layers are deposited over the surface of the disposable hard mask including the created trenches, the deposited copper is polished down to the surface of the dielectric.

BRIEF DESCRIPTION OF THE DRAWINGS

FIGS. 1 and 2 show a cross section of the Prior Art Formation of interconnect trenches, as follows:

FIG. 1 shows a cross section after the trenches for the interconnect lines have been formed, barrier and seed layers have been deposited and the blanket deposition of a layer of copper.

FIG. 2 shows a cross section after the deposited layer of copper has been polished.

FIGS. 3 and 4 address the first embodiment of the invention, as follows:

FIG. 3 show a cross section of interconnect trenches of the first embodiment of the invention that have rounded edges, barrier and seed layers have been deposited over which a blanket layer of copper has been deposited.

FIG. 4 shows the cross section of FIG. 3 after the layer of copper of the first embodiment of the invention has been planarized.

FIG. 5 shows a cross section after a layer of dielectric has been deposited, a hard mask layer has been deposited over the layer of dielectric, trenches have been etched in the layer of dielectric.

FIG. 6 shows a cross section after the surface of the hard mask has been subjected to rf sputter bombardment.

FIG. 7 shows a cross section after barrier and seed layers have been deposited over which a blanket layer of copper has been deposited.

FIG. 8 shows the cross section of FIG. 7 after the layer of copper of the second embodiment of the invention has been planarized.

DESCRIPTION OF THE PREFERRED EMBODIMENTS

Figure 4:
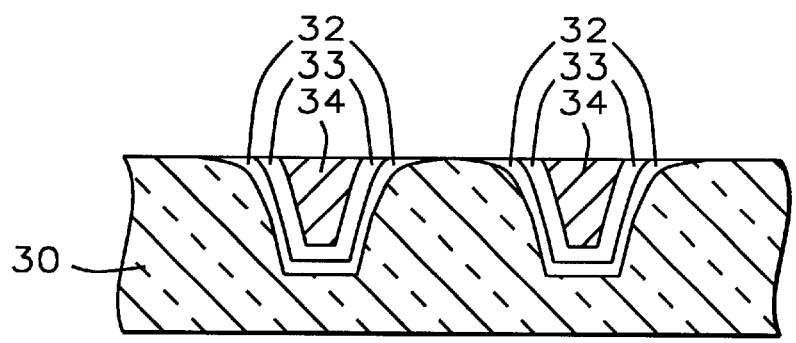

FIGS. 3 and 4 address the first embodiment of the invention.

Referring now specifically to FIG. 3, there is shown a cross section of interconnect trenches 31 of the first embodiment of the invention that have rounded edges, barrier layer 32 and seed layers 33 have been deposited over which a blanket layer 34 of copper has been deposited. Trenches 31 have been created in a low-k dielectric 30.

Layer 30 of Intra Metal Dielectric can contain any suitable dielectric such as for instance silicon dioxide ("oxide", doped or undoped) or silicon nitride ("nitride"), silicon oxynitride, fluoropolymer, parylene, polyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), a low dielectric constant material, such as hydrogen silsesquioxane and HDP-FSG (high-density-plasma fluorine-doped silicate glass.

The most commonly used and therefore the preferred dielectrics are silicon dioxide (doped or undoped), silicon oxynitride, parylene or polyimide, spin-on-glass, plasma oxide or LPCVD oxide.

The deposition of the layer 30 of dielectric uses conventional deposition technology and can, for instance, be deposited using PECVD procedures at a temperature of between about 350 and 450 degrees C. to a thickness between about 5000 and 10,000 Angstrom using TEOS as a source.

The etch for the interconnect trenches can be performed using reactive ion, plasma, sputter etch and RIE.

After the trenches 31 have been create in the layer 30 of low-k dielectric, the surface of the low-k dielectric 30 is subjected to a sputter etch that, under the first embodiment of the invention, is used to round the upper corners 36 of the trenches that have been created in layer 30 of low-k dielectric. The phenomenon of facet formation or faceting as a result of sputter etching is well known in the art. Faceting is where the sidewalls of a trench develop an ever-increasing facet or incline as the process of sputter etching continues. The removal of the low-k dielectric material during the sputter process typically starts at the corners of the trenches that have been created and progressively continues from these corners down into the sidewalls of the trench. The phenomenon of faceting is due to the heavy concentration of the ions of the sputter etch at the most exposed regions of the surface of the etch, in this case the corners of the trench after the essence of the trench has been formed in the layer of dielectric. Once the excess removal of dielectric material has been started, more surface area of the dielectric is exposed to the ion bombardment and the faceting of the sidewalls of the trench can progress relatively rapidly. It is clear that the sputter process can control the sharpness of the angle where the interconnect trench interfaces with the surface of the surrounding dielectric.

The sputter etch results in trenches for the interconnect lines that have rounded corners. Since the problems of poor copper lines formation were at least partially caused by sharp corners in the trenches where the overlying barrier layer and seed layer interface with the trench, the rounding off of the corner of the interface results in a sharp reduction of the tension that is typically created in overlying layers where these layers overlay profiles of sharp angles. The barrier layer 32 and the seed layer 33 that are now deposited over a corner 36 that is critically reduced in sharpness, lower stress and more controlled patterns of stress will now occur in the barrier layer 32 and the seed layer 33 where these layers are in contact with the corners 36 of the trenches. This lower stress results in better adhesion of the barrier and seed layers to the upper regions of the sidewalls of the trenches 31 resulting in better adhesion of these layers to the sidewalls resulting finally in a layer of copper that is less prone to present problems of surface damage.

Barrier layer 32 and seed layer 33 are deposited using conventional materials and methods as have already been detailed previously under FIG. 1. The process of the first embodiment of the invention is completed by removing the excess copper of layer 34 from above the dielectric 30, using methods of CMP, resulting in a patterns of copper interconnect lines that is shown in cross section in FIG. 4.

It must be noted that the first embodiment of the invention can in addition use a disposable hard mask layer (not shown in FIGS. 3 and 4) that is deposited directly over the surface of the dielectric 30 and that is etched at the time that the trenches are etched in the surface of the dielectric. This hard mask layer further improves metal line adhesion as will be highlighted below as the second embodiment of the invention.

FIGS. 5 through 8 address the second embodiment of the invention.

Figure 5:
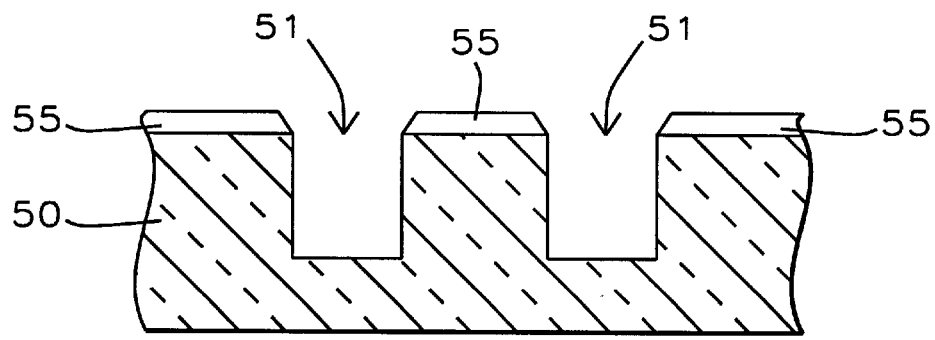
FIGS. 5 through 8 address the second embodiment of the invention, as follows.

Referring now first to FIG. 5, there is shown a cross section of a low-k dielectric layer 50 over which a disposable hard mask layer 55 has been deposited. Trenches 51 have been created in the layer 50 of low-k dielectric.

Considerations of dielectric material that can be used for layer 50 of low-k dielectric and method of deposition of this layer are the same as have previously been detailed under FIG. 3 for the first embodiment of the invention. Layer 50 of low-k dielectric can be etched using standard photolithography and RIE procedures, using $CF_4/CHF_3$ as etchant gas.

After layer 50 has been deposited a layer 55 of sacrificial hard mask is deposited over the surface of the dielectric layer 50. The sacrificial hard mask layer 55 of SiN or SiON or SiC is sputter deposited over the planarized surface of the dielectric layer 50 to a thickness between about 100 and 400 Angstrom. The hard mask 55 is opaque to the actinic light that is used in photolithography, so that light will not be reflected from it as it is reflected from the dielectric layer around the neck of the trench openings. This results in formation of trenches with sharp angles at the interface between these trenches and the surrounding dielectric 50.

The hard mask layer 55 can be etched by applying, for example, an anisotropical etch using a solution of ammonium and hydrogen peroxide with an etch rate between about 300 and 900 Angstrom per minute. This removal of the hard mask simultaneously removes the corners of the trenches of the interconnect lines.

Layer 50 of low-k dielectric can be etched using standard photolithography and RIE procedures, using $CF_4/CHF_3$ as etchant gas.

Figure 6:
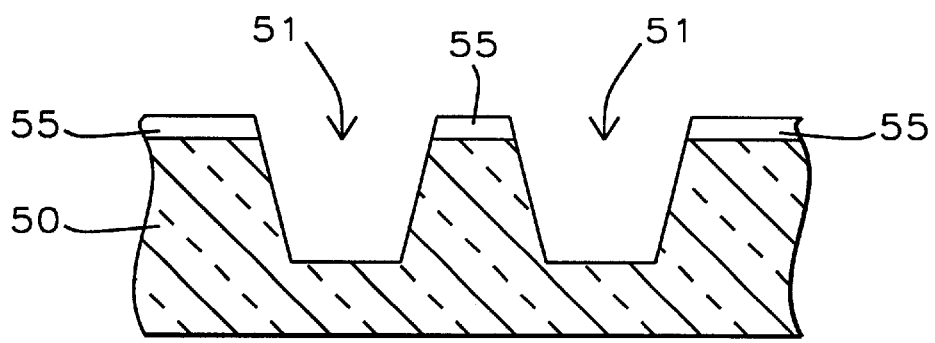

FIG. 6 shows a cross section after the surface of the structure of FIG. 5 has been subjected to the process of RF sputter. As can be noticed in FIG. 5, the hard mask layer 55 tapers downward toward the trenches in the immediate vicinity of the trenches. There is therefore a thinner layer of the hard mask layer 55 in place around the immediate vicinity of the upper perimeter of the trenches, the process of rf sputter therefore does not only remove the hard mask from above the layer 50 of dielectric in the immediate vicinity of the perimeter of the trenches but, while this removal is in progress and before the thinner layer of hard mask is removed, the rf sputter will remove the upper reaches of the sidewalls of the interconnect trenches. This is in accordance with the objective of the second embodiment of the invention, again resulting in reduction of molecular tension and improvement of the copper line characteristics.

Figure 7:
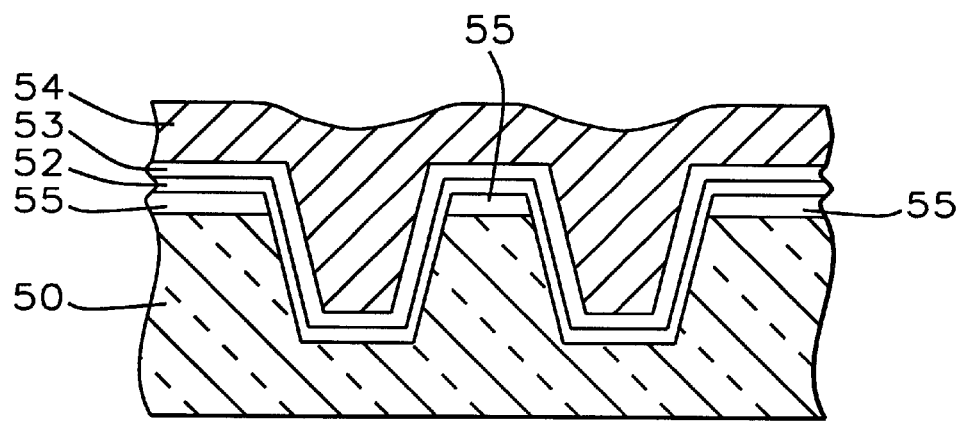

FIG. 7 shows how the layers 52 of barrier material, the seed layer 53 and a layer 54 of pure copper can next be deposited over the surface of the hard mask 55 thereby including the inside of the trenches 51. The layer 54 of copper is next blanket deposited over the surface of the seed layer 53 including the inside of the trenches 51. The excess copper is removed from the surface of the dielectric layer 50 using CMP, thereby also removing the seed layer 53, barrier layer 52 and hard mask layer 55 from above the surface of the layer 50 of dielectric.

Figure 8:
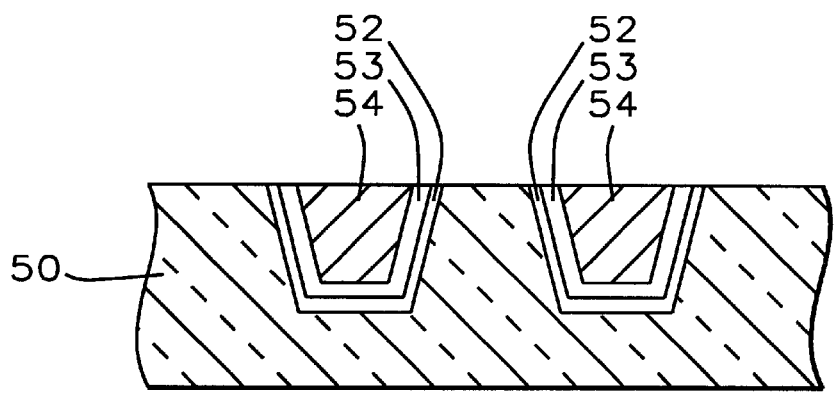

FIG. 8 shows a cross section of the completed copper filled trenches 54 of the interconnect lines. The copper filled interconnect metal 54 is embedded in the barrier layer 52 and the seed layer 53.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating interconnecting conductive lines and conductive vias in a layer of insulating material, comprising the steps of:

providing a semiconductor substrate;

depositing a layer of dielectric over a surface of said substrate;

planarizing a surface of said layer of dielectric;

creating trenches or openings in said layer of dielectric for deposition of metal thereby creating a pattern of interconnect lines or interconnect vias;

sputter etching said created trenches or openings thereby faceting sidewalls of said trenches or openings by developing an ever-increasing facet or incline of sidewalls of said trenches or openings;

depositing a barrier layer over a surface of said layer of dielectric thereby including inside surfaces of said trenches or openings;

depositing a seed layer over a surface of said barrier layer;

depositing a layer of copper over a surface of said seed layer; and polishing said layer of copper thereby forming a pattern of interconnect lines or interconnect vias.

2. The method of claim 1 wherein said creating trenches or openings in said layer of dielectric is performed using reactive ion, plasma, sputter etch or RIE technologies.

3. The method of claim 1 wherein said depositing a barrier layer over a surface of said layer of dielectric is depositing a layer of material selected from a group containing titanium nitride, tantalum, tungsten, niobium, molybdenum, Ti/TiN and Ti/W and is more preferably formed from TiN using rf sputtering of said barrier material whereby said barrier layer is preferably about 100 and 500 angstrom thick and more preferably about 300 angstrom thick.

4. The method of claim 1 wherein said depositing a seed layer over a surface of said barrier layer is using a sputter chamber or an Ion Metal Plasma (IMP) chamber at a temperature of between about 0 and 300 degrees C. and a pressure of between about 1 and 100 mTorr using copper or a copper alloy as a source at a flow rate of between about 10 and 400 sccm and using argon as an ambient gas whereby said seed layer is deposited to a minimum thickness of about 50 Angstrom.

5. The method of claim 1 with the additional step of depositing a hard mask layer over a surface of said layer of dielectric said step to be performed immediately prior to said step of creating trenches or openings in said layer of dielectric whereby said hard mask contains SiN or SiON or SiC and is sputter deposited over said planarized surface of said dielectric layer to a thickness between about 100 and 400 Angstrom.

6. The method of claim 1 wherein said polishing said layer of copper uses CMP techniques whereby said polishing of said layer of copper is continued to where a surface of said layer of dielectric is essentially reached.

7. A method of creating interconnecting conductive lines and conductive vias in a layer of insulating material, comprising the steps of:

providing a semiconductor substrate;

depositing a layer of dielectric over a surface of said substrate;

planarizing a surface of said layer of dielectric;

depositing a sacrificial hard mask layer over a surface of said layer of dielectric;

patterning and etching said hard mask layer thereby creating openings in said hard mask said openings to have a pattern that coincides with a pattern of said interconnecting conductive lines and conductive vias that are to be created in said layer of dielectric;

creating trenches or openings in said layer of dielectric for deposition of metal thereby creating a pattern of interconnecting conductive lines and conductive vias;

sputter etching said created trenches or openings thereby faceting sidewalls of said trenches or openings by developing an ever-increasing facet or incline of sidewalls of said trenches or openings;

depositing a barrier layer over a surface of said hard mask layer thereby including inside surfaces of said pattern of interconnecting conductive lines and conductive vias;

depositing a seed layer over a surface of said barrier layer;

depositing a layer of copper over a surface of said seed layer; and polishing said layer of copper thereby forming a pattern of interconnecting conductive lines and conductive vias.

8. The method of claim 7 wherein said depositing a sacrificial hard mask layer over a surface of said layer of dielectric is a sputter deposition process whereby said hard mask contains SiN or SiON or SiC and is sputter deposited over said planarized surface of said dielectric layer to a thickness between about 100 and 400 Angstrom.

9. The method of claim 7 wherein said patterning and etching said hard mask layer uses steps of photolithography whereby said hard mask layer is etched by applying an anisotropical etch using a solution of ammonium and hydrogen peroxide with an etch rate between about 300 and 900 Angstrom per minute thereby removing said hard mask in a pattern that is identical to a pattern of said interconnecting conductive lines and conductive vias whereby furthermore said removal of said hard mask simultaneously removes corners of said trenches or openings of said interconnecting conductive lines and said conductive vias.

10. The method of claim 7 wherein said creating trenches or openings in said layer of dielectric is performed using reactive ion, plasma, sputter etch or RIE technologies.

11. The method of claim 7 wherein said depositing a barrier layer over a surface of said hard mask layer thereby including inside surfaces of said trenches or openings is depositing a layer of material selected from a group containing titanium nitride, tantalum, tungsten, niobium, molybdenum, Ti/TiN or Ti/W and is more preferably formed from TiN using rf sputtering of said barrier material whereby said barrier layer is preferably about 100 and 500 angstrom thick and more preferably about 300 angstrom thick.

12. The method of claim 7 wherein said depositing a seed layer over a surface of said barrier layer is using a sputter chamber or an Ion Metal Plasma (IMP) chamber at a temperature of between about 0 and 300 degrees C. and a pressure of between about 1 and 100 mTorr using copper or a copper alloy as a source at a flow rate of between about 10 and 400 sccm and using argon as an ambient gas whereby said seed layer is deposited to a minimum thickness of about 50 Angstrom.

13. The method of claim 7 wherein said polishing said layer of copper uses CMP techniques whereby said polishing of said layer of copper is continued to where a surface of said layer of dielectric is essentially reached.

* * * * *